(12) United States Patent
Sakaguchi

(10) Patent No.: US 7,057,352 B2
(45) Date of Patent: Jun. 6, 2006

(54) PARTICLE HOLDING SHEET, METHOD OF MANUFACTURING PARTICLE HOLDING SHEET AND ORGANIC ELECTROLUMINESCENT DISPLAY HAVING PARTICLE HOLDING SHEET

(75) Inventor: Yoshikazu Sakaguchi, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 421 days.

(21) Appl. No.: 10/118,158

(22) Filed: Apr. 9, 2002

(65) Prior Publication Data
US 2002/0145128 A1    Oct. 10, 2002

(30) Foreign Application Priority Data
Apr. 10, 2001    (JP)    ............... 2001-111948

(51) Int. Cl.
*G09G 3/10*    (2006.01)
(52) U.S. Cl. .................... 315/169.1; 345/214
(58) Field of Classification Search ............ 315/169.1, 315/169.3; 348/373; 345/204, 211, 214
See application file for complete search history.

(56) References Cited

U.S. PATENT DOCUMENTS

| | | | |
|---|---|---|---|
| 4,446,187 A * | 5/1984 | Eklund | ............ 428/136 |
| 5,610,655 A * | 3/1997 | Wakabayashi et al. | ...... 348/373 |
| 6,117,538 A * | 9/2000 | Hirata et al. | ............ 428/315.9 |
| 6,548,960 B1 * | 4/2003 | Inukai | ............ 315/169.3 |
| 6,558,774 B1 * | 5/2003 | Saliba et al. | ............ 428/156 |
| 6,617,784 B1 * | 9/2003 | Abe et al. | ............ 313/506 |

FOREIGN PATENT DOCUMENTS

| EP | 733436 A1 * | 9/1996 |
|---|---|---|
| EP | 0733436 A1 * | 9/1996 |

* cited by examiner

*Primary Examiner*—Wilson Lee
*Assistant Examiner*—Jimmy Vu
(74) *Attorney, Agent, or Firm*—H. C. Park & Associates, PLC

(57) ABSTRACT

Moisture absorbent is embedded in a sheet-type support by a centrifugal force. A gas permeable sheet is fixed to one face of the support via an adhesive layer and a protection sheet is fixed to the other face of the sheet-type support via an adhesive layer. In this way, a moisture absorbent sheet is previously prepared. When in an organic EL display, the protection sheet is removed from the moisture absorbent sheet, the adhesive layer comes into contact with an opposed face of a seal cap and the moisture absorbent sheet is fixed to the opposed face. The seal cap is put on a transparent insulating substrate in which an anode layer, organic EL lamination body, and a cathode layer are laminated. The seal cap comes into contact with the transparent insulating substrate via seal resin of ultraviolet-curable type and ultraviolet rays are irradiated so as to complete the organic EL display.

14 Claims, 12 Drawing Sheets

13;moisture absorbent

15;sheet-type support

18;adhesive layer
15
16;adhesive layer

7;moisture absorbent sheet
19  18
15
17  16

PARTICLE HOLDING SHEET, METHOD OF MANUFACTURING PARTICLE HOLDING SHEET AND ORGANIC ELECTROLUMINESCENT DISPLAY HAVING PARTICLE HOLDING SHEET

BACKGROUND OF THE INVENTION

1. Field of the Invention

The present invention relates to a particle holding sheet, a method of manufacturing the particle holding sheet and an organic EL (ElectroLuminescent) display having the particle holding sheet, and more particularly, relates to an moisture absorbent sheet, a method of manufacturing the moisture absorbent sheet and an organic EL display, suitable for removing moisture in a sealed space using an moisture absorbent as a particle when the organic EL elements are hermetically sealed by adhering a substrate on which organic EL elements are formed to a seal cap in the organic EL display. Hereafter, the present invention will be explained using the moisture absorbent sheet and the organic EL display having the moisture absorbent sheet, however, particles are not limited to the moisture absorbent in the present invention.

The present application claims priority of Japanese Patent Application No. 2001-111948 filed on Apr. 10, 2001, which is hereby incorporated by reference.

2. Description of Related Art

An organic EL (ElectroLuminescent) display element has a structure in which a luminescent layer made of an organic compound is put between an anode and a cathode. By applying a direct voltage to the anode and the cathode of the organic EL display element, holes injected from the anode and electrons injected from the cathode are recombined in the luminescent layer to make an excitation state. Then, luminescence occurs in a relaxation process from the excitation state to a ground state.

The organic EL display has good characteristics which cannot be provided by a liquid crystal display, for example, the organic EL display can be a self-luminescent thin flat display with a rapid response ability and a wide angle of visibility.

However, since the organic EL element deteriorates by moisture infiltration, a sufficient lifetime can not be obtained. For example, with the moisture penetrating an interface between the luminescent layer and an electrode, the electrons are prevented from injecting. Therefore, a display quality is deteriorated since a dark spot which is a non-luminescent area generates in the luminescent layer, the electrode corrodes and the dark spot grows to reduce the luminescent area.

Therefore, it is considered that influences of the moisture and a like are prevented by hermetically sealing the organic EL element. For example, an organic EL display is proposed in which the organic EL element is enclosed in a container having no moisture permeability with nitrogen gas and moisture absorbent.

An organic EL display 101, as shown in FIG. 14, is provided with a transparent insulating substrate 102 such as a glass substrate, an anode layer 103, an organic EL lamination body 104 including a luminescent layer, a cathode layer 105 and a seal cap 106. A moisture absorbent 107 is stored in a concave portion 106a formed in the seal cap 106.

The anode layer 103 is formed on the transparent insulating substrate 102 and is made of transparent conductive material such as ITO (Indium Tin Oxide).

The organic EL lamination body 104, for example, as shown in FIG. 14, includes a hole transport layer 108, a luminescent layer 109 and an electron transport layer 110, in that order, on the anode layer 103.

The hole transport layer 108 is made of TPD: N,N'-diphenyl-N,N'-di(3-methylphenyl)-1,1'-biphenyl-4,4'-diamine or alike.

The luminescent layer 109 is made of $Alq_3$: tris (8-hydroxyquinolinol) Aluminum. The electron transport layer 110 is made of 3-(4-biphenylyl)-4-phenyl-5-(4-t-butylphenyl)-1,2,4-triazole or a like.

The cathode layer 105 is formed on the organic EL lamination body 104 and is made of aluminum or a like.

The seal cap 106 is made of metal material such as stainless steel, glass, or a like and seals the anode layer 103, the organic EL lamination body 104, and the cathode layer 105. The seal cap 106 has the concave portion 106a for keeping the moisture absorbent 107 and is put on the transparent insulating substrate 102 to cover the anode layer 103, the organic EL lamination body 104, and the cathode layer 105 via a seal resin 111.

The moisture absorbent 107 is composed of particles such as BaO and is held by a gas permeable sheet 112 while being kept in the concave portion 106a of the seal cap 106.

A method of manufacturing the organic EL display 101 will be explained.

First, the anode layer 103 such as ITO is formed on the transparent insulating substrate 102 such as a glass substrate by a sputtering technique or a like. On the transparent insulating substrate 102 on which the anode layer 103 is formed, N,N'-diphenyl-N,N'-di(3-methylphenyl)-1,1'-biphenyl-4,4'-diamine) or a like, tris (8-hydroxyquinolinol) aluminum or a like, 3-(4-biphenylyl)-4-phenyl-5-(4-t-butylphenyl)-1,2,4-triazole or a like are deposited by an evaporation technique. With these processes, the organic EL lamination body 104 including the hole transport layer 108, the luminescent layer 109 and the electron transport layer 110 is formed.

Then, the cathode layer 105 such as aluminum is formed on the organic EL lamination body 104 by the evaporation technique using a shadow mask.

As shown in FIG. 15A, the seal cap 106 in which the concave portion 106a is formed is prepared, as shown in FIG. 15B, the moisture absorbent 107 is stored in the concave portion 106a of the seal cap 106 and, as shown in FIG. 15C, the moisture absorbent 107 is covered with the gas permeable sheet 112 so as to be held.

The seal resin 111 of an ultraviolet-curable type is coated on a lower end face of a side wall of the seal cap 106 which holds the moisture absorbent 107. Then, under an inert gas atmosphere such as nitrogen gas or argon gas, the seal cap 106 is put on the transparent insulating substrate 102 and a side wall end face 106b of the seal cap 106 is jointed to the transparent insulating substrate 102 via the uncured seal resin 111.

Then, ultraviolet rays are irradiated from the side of the transparent insulating substrate 102 so as to cure the seal resin 111. Therefore, the organic EL lamination body 104 is sealed by the seal cap 106 while being filled with inert gas such as nitrogen gas or argon gas. With these processes, the organic EL display 101 is completed.

However, in the conventional technique, there is a problem in that it takes time to store the moisture absorbent 107 in the step of keeping the moisture absorbent 107 in the concave portion 106a of the seal cap 106.

In other words, since the moisture absorbent 107 is composed of particles which are apt to be electrified. When the moisture absorbent 107 is stored in the concave portion 106a of the seal cap 106, the moisture absorbent 107 flies and overflows. Therefore, there are problems in that it is difficult to store an accurate amount of the moisture absorbent 107 certainly and in that an operation is complicated and it takes a great amount of working time.

Also, since the concave portion 106a for storing the moisture absorbent 107 is formed in the seal cap 106, a thickness of the seal cap 106 is bigger. Therefore, there is another problem in that the organic EL display is prevented from being thin and small as a whole.

Additionally, these problems also occur in a solar battery module or a like which is necessary to have moisture resistance, and therefore are not only limited to the organic EL display.

SUMMARY OF THE INVENTION

In view of the above, it is a first object of the present invention to provide a moisture absorbent sheet, a method of manufacturing the moisture absorbent sheet and an organic EL display capable of filling a desired amount of moisture absorbent into a sealed space formed by a seal cap and a transparent insulating substrate with an organic EL lamination body certainly and capable of carrying out a filling operation of the moisture absorbent without a trouble, easily and speedily.

Also, it is a second object of the present invention to provide a moisture absorbent sheet, a method of manufacturing the moisture absorbent sheet and an organic EL display capable of making the organic EL display thin and small as a whole.

According to a first aspect of the present invention, there is provided a particle holding sheet for holding a plurality of particles in such a manner that the plurality of particles is held by a support of a sheet-type, wherein the support has a plurality of spaces connecting to an outside at least at a face of the support and at least a part of the particles is held in one of the spaces.

In the foregoing, a preferable mode is one wherein a gas permeable sheet for allowing air pass and for not allowing the particles pass is fixed to a face of the support and an adhesive layer is arranged on another face of the support.

Also, a preferable mode is one wherein the support is made of woven fabric or unwoven fabric.

Also, a preferable mode is one wherein the support is made of foam materials.

Also, a preferable mode is one wherein the particles are moisture absorbent.

Also, a preferable mode is one wherein the support is made of water-absorbing polymeric materials.

Also, a preferable mode is one wherein the moisture absorbent absorbs moisture physically and/or chemically.

Also, a preferable mode is one wherein the moisture absorbent is made of at least any one of calcium oxide, barium oxide, magnesium oxide, aluminum oxide, and phosphorus oxide.

Furthermore, a preferable mode is one wherein the moisture absorbent is made of at least any one of zeolite, silica gel, and activated carbon.

According to a second aspect of the present invention, there is provided a method of manufacturing a particle holding sheet for holding particles in such a manner that said particles are held by a support of a sheet-type, the method including:

a step of putting the particles into a rotation body which is hollow;

a step of arranging the support inside of a side wall portion of the rotation body;

a step of causing the rotation body to rotate at a predetermined rotation speed for a predetermined time around a rotation axis of the rotation body; and a step of causing the particles to collide with the support by using a centrifugal force to hold a predetermined amount of the particles by the support.

In the foregoing, a preferable mode is one wherein the support has a plurality of spaces connecting to an outside at least at a face of the support, the support being arranged inside of a side wall portion of the rotation body so that the plurality of spaces are positioned at a central side of the rotation body.

According to a third aspect of the present invention, there is provided a method of manufacturing a particle holding sheet for holding particle by using a support of a sheet-type, the method including:

a step of putting the particles into a rotation body of which a side wall portion has a plurality of small apertures or is made of a mesh member and which is hollow;

a step of arranging the support outside of the side wall portion of the rotation body;

a step of causing the rotation body to rotate at a predetermined rotation speed for a predetermined time around a rotation axis of the rotation body; and a step of diffusing the particles out of the rotation body by a centrifugal force to cause the support to hold a predetermined amount of the particles.

In the foregoing, a preferable mode is one wherein the support has a plurality of spaces connecting to an outside at least at a face of the support, the support is fixed to a support fitting member and is arranged outside of the side wall portion of the rotation body so that the plurality of spaces are positioned at a central side of the rotation body, and the support fitting member to which the support is fixed is rotated at the predetermined rotation speed for the predetermined time around the rotation axis of the rotation body in a direction same or reverse to a rotation direction of the rotation body.

According to a fourth aspect of the present invention, there is provided a method of manufacturing a particle holding sheet for holding particles such that the particles are held by a support of a sheet-type, the method including:

a step of scattering the particles on the support having a space connecting to an outside at least at a face of the support; and a step of pressing the particles together with the support by using a press tool to cause the support to hold a predetermined amount of the particles.

In the foregoing, a preferable mode is one wherein the press tool is a pair of rollers, the particles are scattered over the support and are inserted between the pair of rollers to be pressed whereby the particles are held by the support.

Also, a preferable mode is one wherein the particles are moisture absorbent.

According to a fifth aspect of the present invention, there is provided an organic EL display provided with a particle holding sheet for holding a plurality of particles in such a manner that the plurality of particles is held by a support of a sheet-type, wherein the support has a plurality of spaces connecting to an outside at least at a face of the support and at least a part of the particles is held in one of the spaces.

With the above configurations, since particles are embedded and held by the support having spaces by the centrifugal force, it is possible to fill the support with a desired amount of the moisture absorbent certainly and accurately by adjusting the rotation speed of the rotation body, the effluence time of the moisture absorbent or a like.

Also, by scattering the particles on the support and by pressing with the press tool together with the support, the particles are embedded and held by the support, and therefore, it is possible to embed the plurality of the particles in the spaces of the support speedily.

Further, when the organic EL display is manufactured, the particle holding sheet for holding the moisture absorbent as the particles is put into the seal cap together with the organic EL lamination body, and a like, and therefore, it is possible to enclose a predetermined amount of the moisture absorbent certainly and accurately and it is possible to enclose the moisture absorbent easily and speedily without troubles. It is also possible to reduce a number of steps required to manufacture the organic EL display.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes for carrying out the present invention will be described in further detail using embodiments with reference to the accompanying drawings.

FIRST EMBODIMENT

Figure 1:
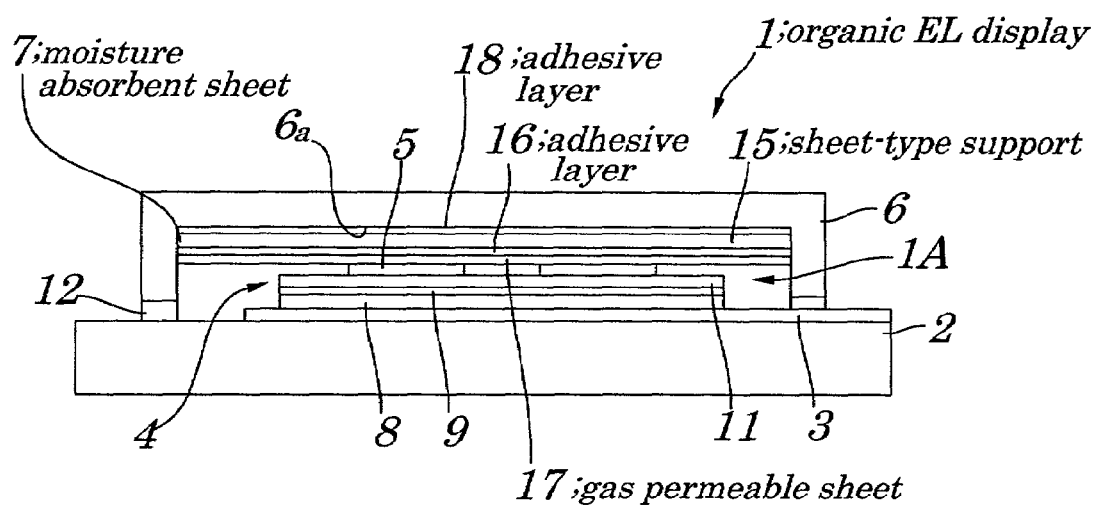
FIG. 1 is a sectional view showing a schematic structure of an organic EL display according to a first embodiment of the present invention.
Figure 2:
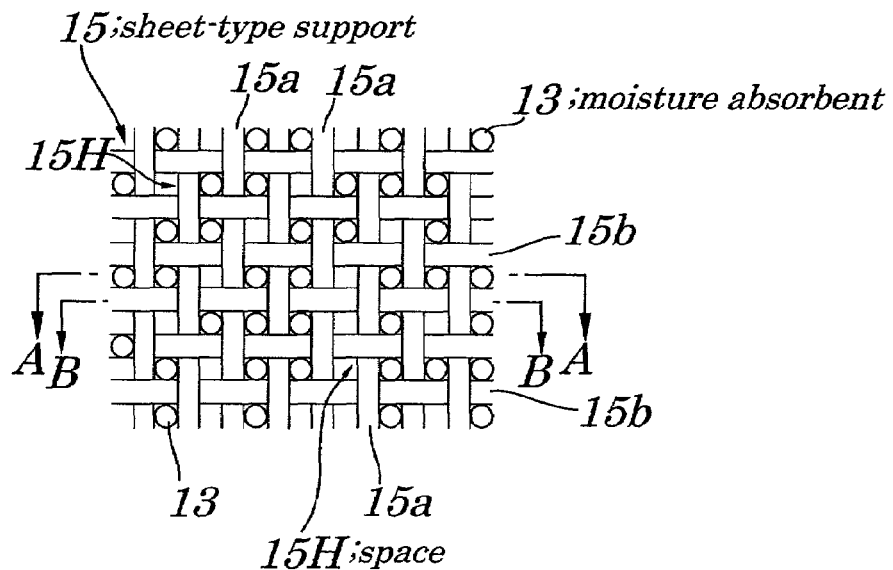
FIG. 2 is a view showing a structure of an essential part of a moisture absorbent sheet of the organic EL display.
Figure 3A:
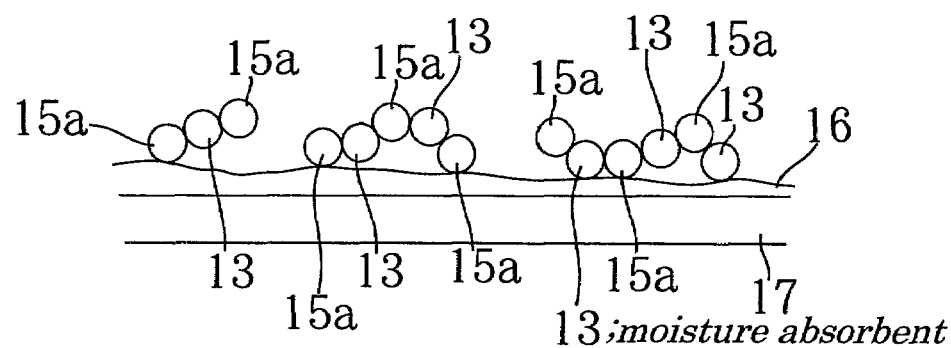
FIG. 3A is a sectional view showing the essential part of the moisture absorbent sheet along a line A—A in FIG. 2
Figure 3B:
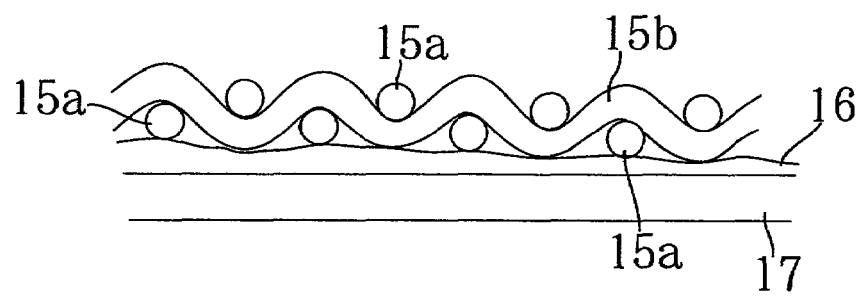
FIG. 3B is a sectional view showing the essential part of the moisture absorbent sheet along a line B—B in FIG. 2.
Figure 4:
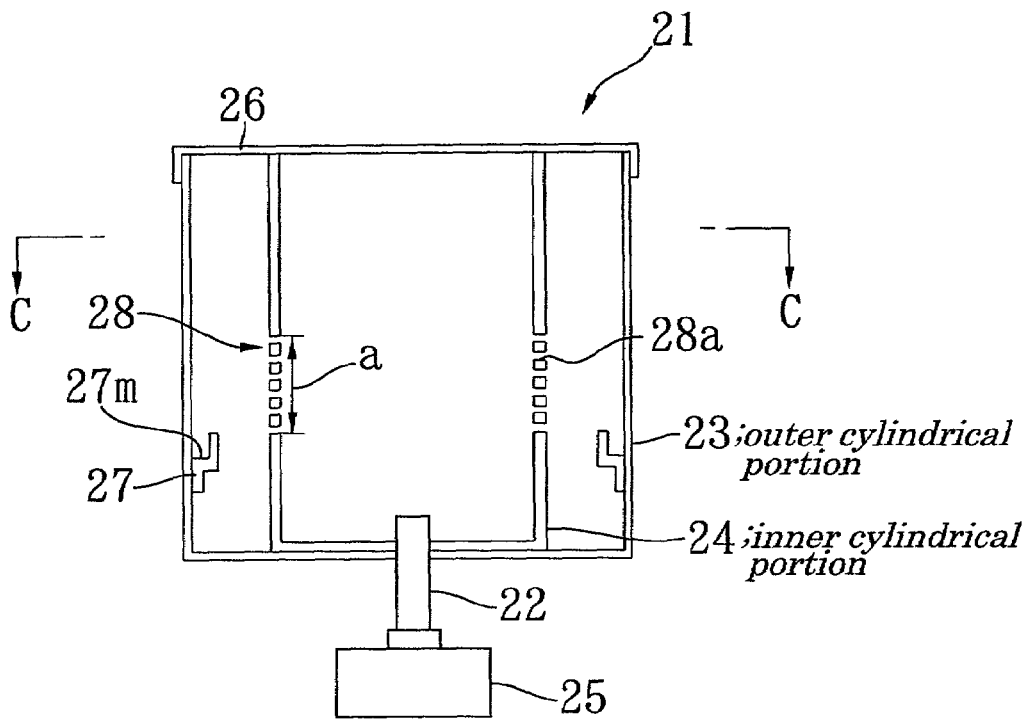
FIG. 4 is a sectional view showing a structure of a moisture absorbent filling apparatus when the moisture absorbent sheet is manufactured.
Figure 5:
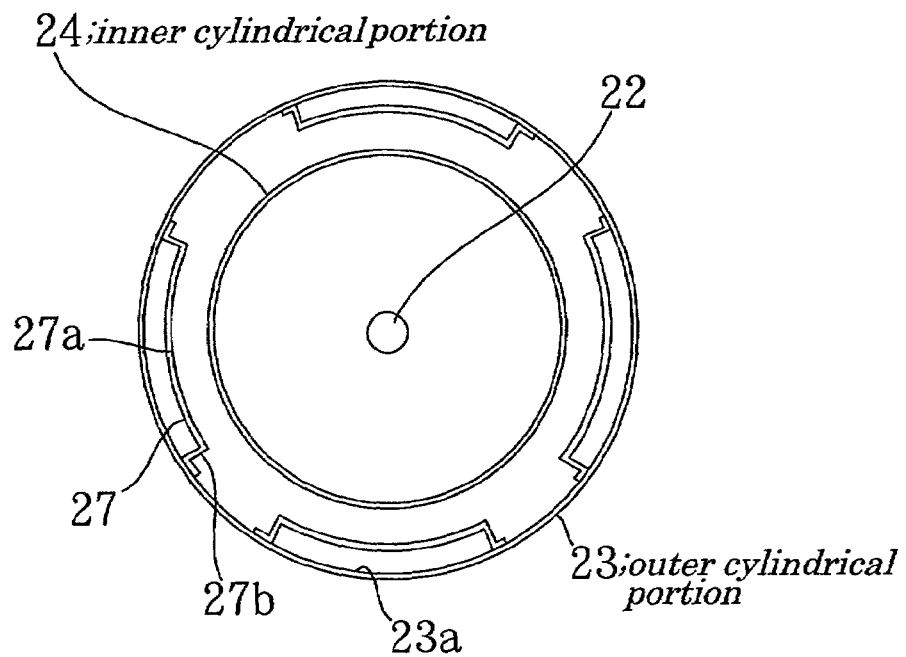
FIG. 5 is a sectional view along a line C—C in FIG. 4.
Figure 6:
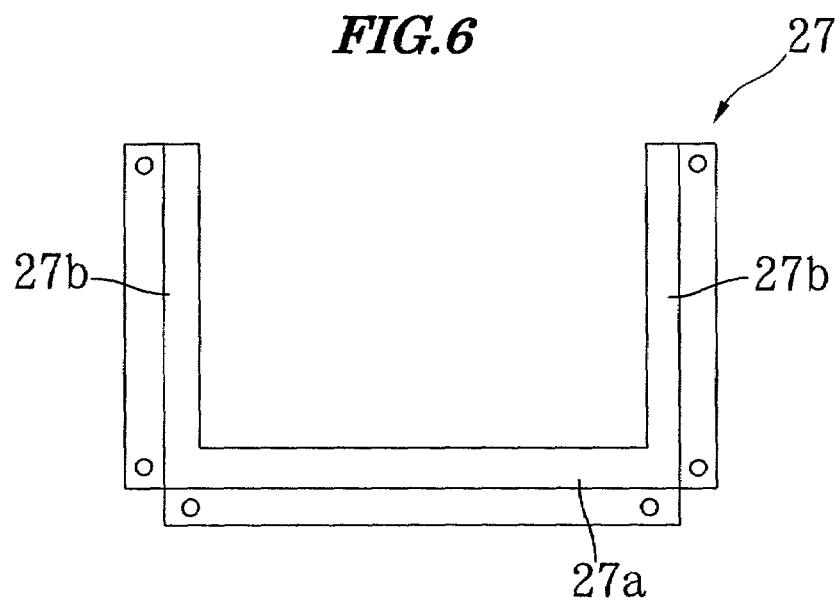
FIG. 6 is a view showing a structure of a sheet support portion of the moisture absorbent filling apparatus.
Figure 7:
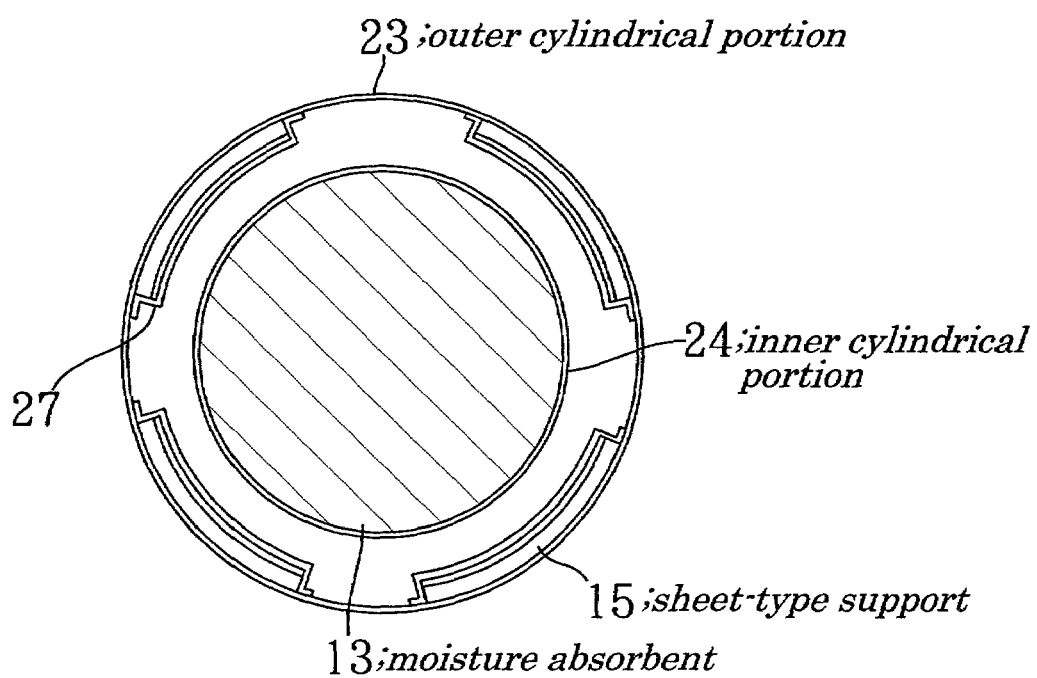
FIG. 7 is an explanatory view for explaining a method of manufacturing the moisture absorbent sheet.
Figure 8:
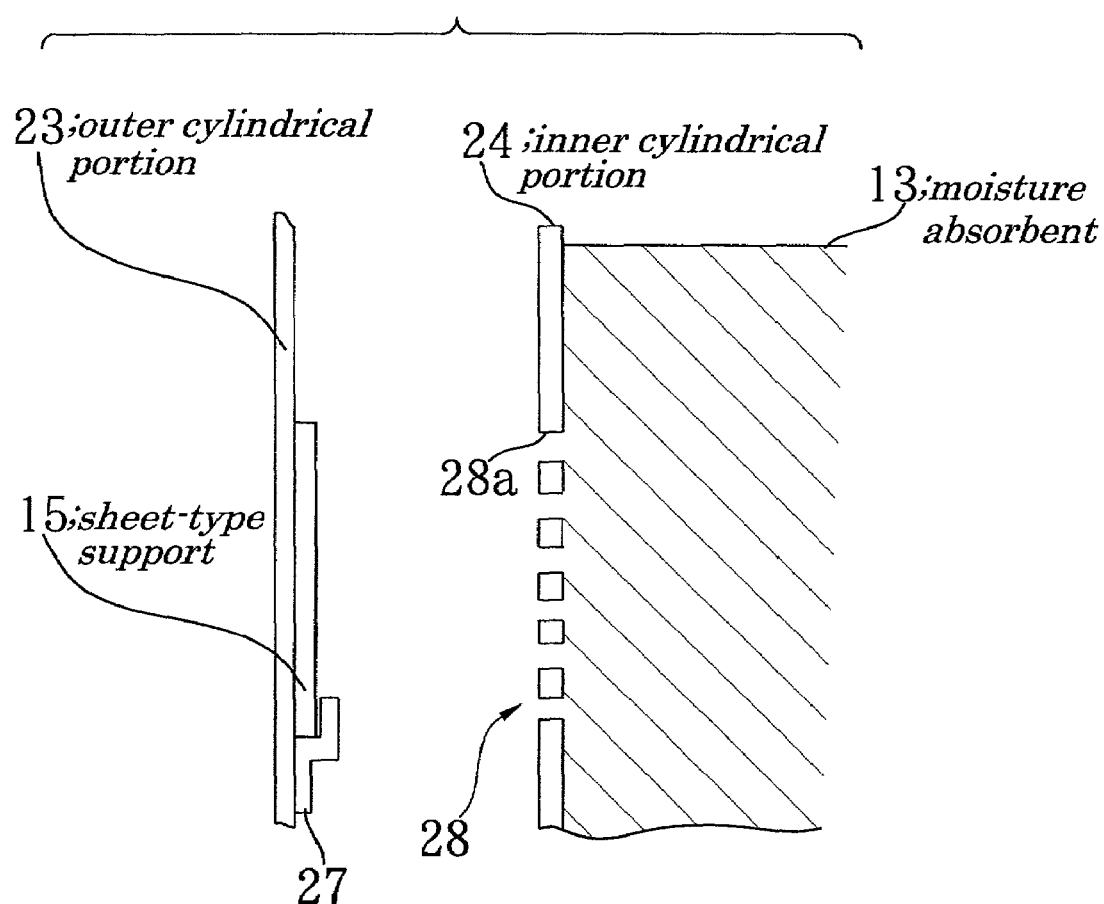
FIG. 8 is an explanatory view for explaining the method of manufacturing the moisture absorbent sheet.
Figure 9A:
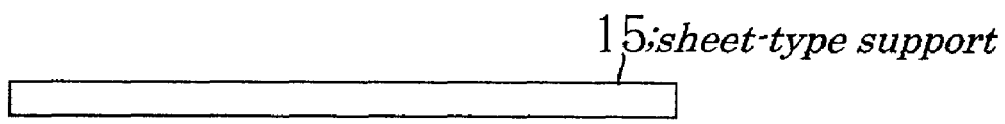
FIGS. 9A, 9B, and 9C are process views for explaining the method of manufacturing the moisture absorbent sheet.
Figure 9B:
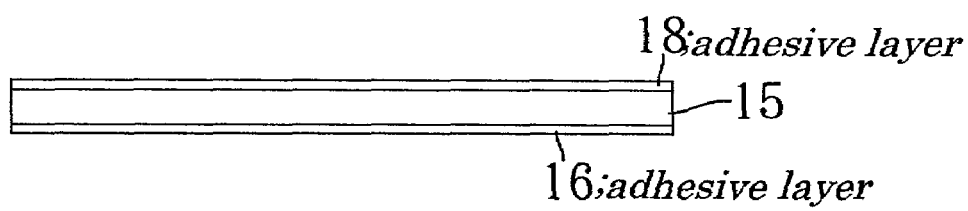
Figure 9C:
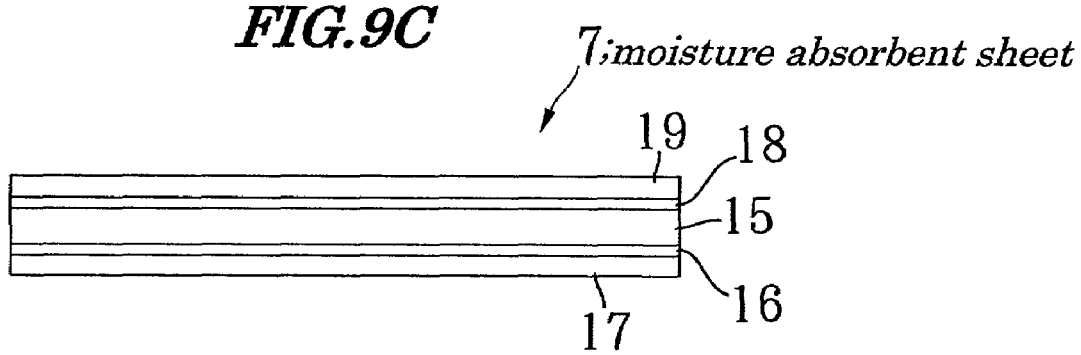
Figure 10A:
FIGS. 10A, 10B, and 10C are process views for explaining a method of manufacturing the organic EL display.
Figure 10B:
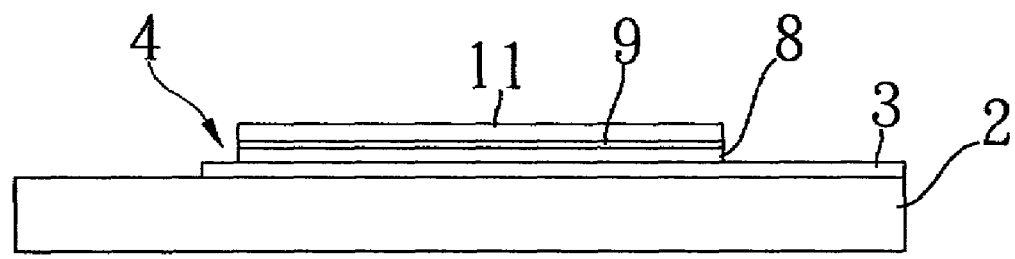
Figure 10C:
Figure 11:
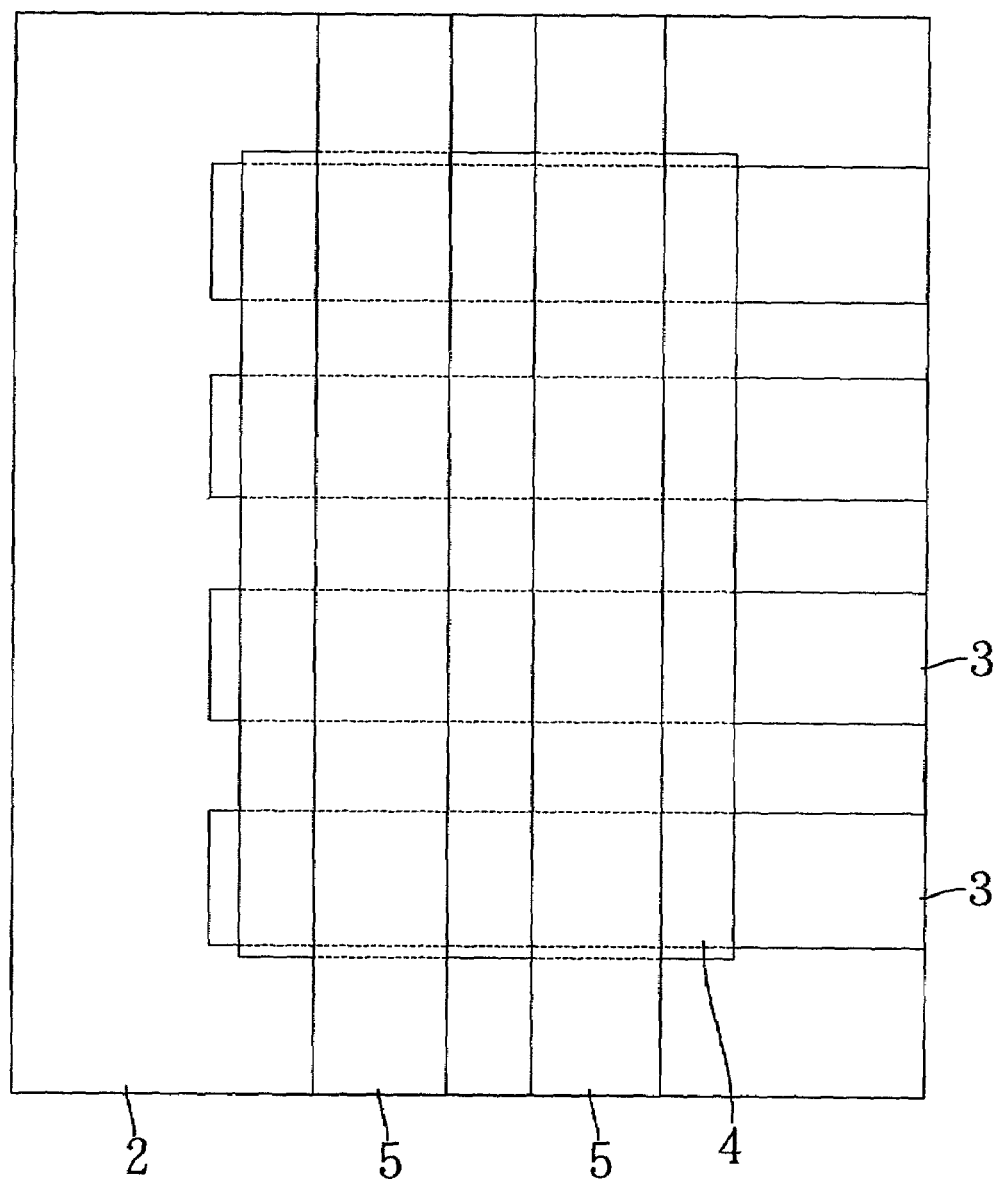
FIG. 11 is an explanatory view for explaining a method of manufacturing the organic EL display.
Figure 12A:
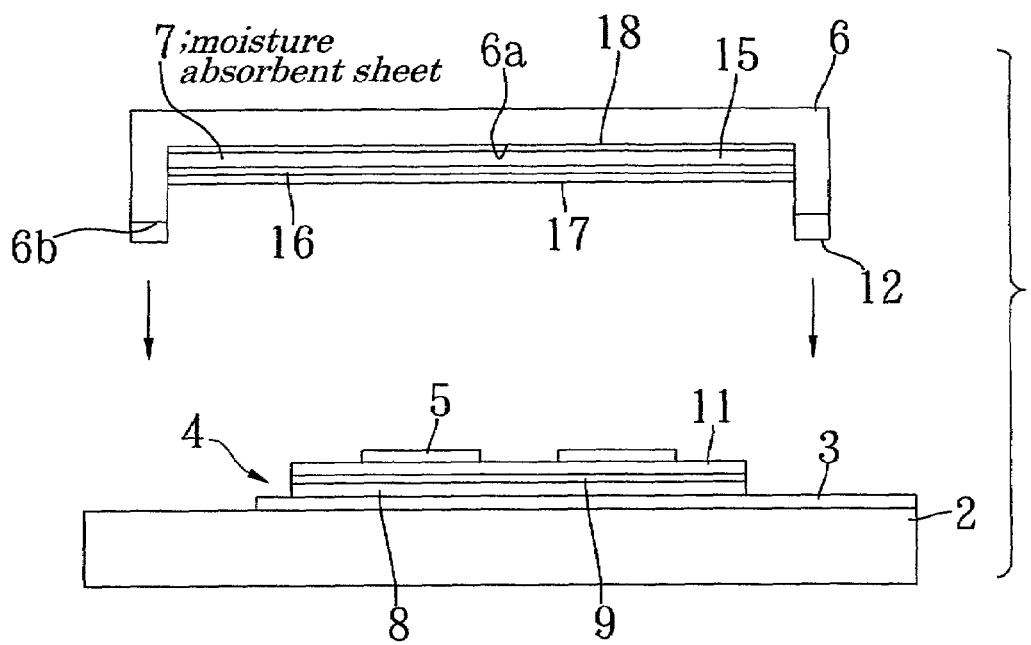
FIGS. 12A and 12B are process views for explaining the method of manufacturing the organic EL display.
Figure 12B:
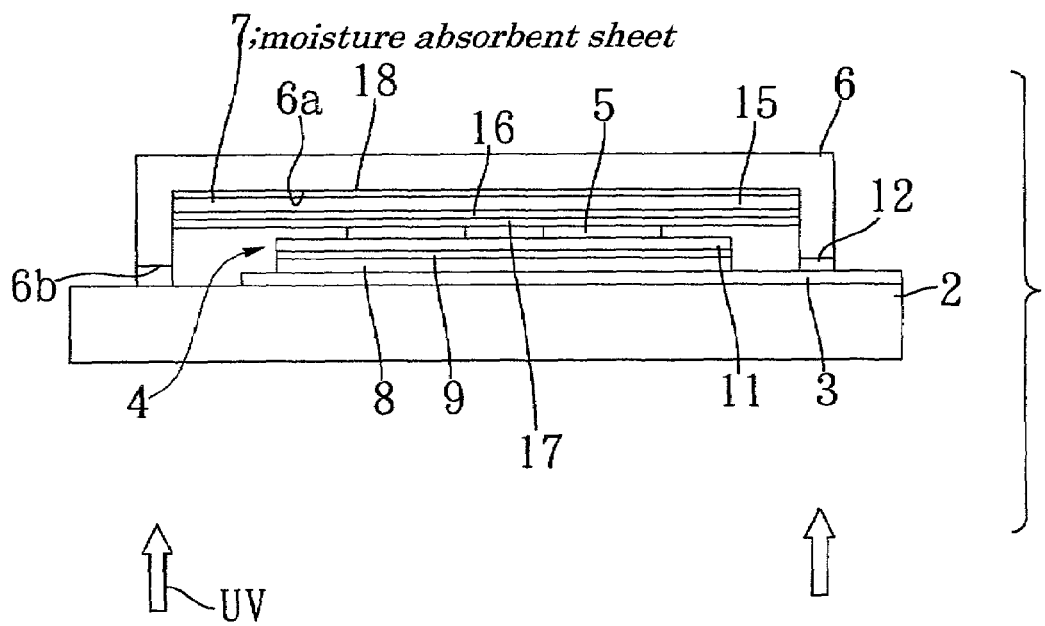

FIG. 1 is a sectional view showing a schematic structure of an organic EL display according to a first embodiment of the present invention, FIG. 2 is a view showing a structure of an essential part of a moisture absorbent sheet of the organic EL display, FIG. 3A is a sectional view showing the essential part of the moisture absorbent sheet along a line A—A in FIG. 2 and FIG. 3B is a sectional view along a line B—B in FIG. 2, FIG. 4 is a sectional view showing a structure of a moisture absorbent filling apparatus when the moisture absorbent sheet is manufactured, FIG. 5 is a sectional view along a line C—C in FIG. 4, FIG. 6 is a view showing a structure of a sheet support portion of the moisture absorbent filling apparatus, FIG. 7 and FIG. 8 are explanatory views for explaining a method of manufacturing the moisture absorbent sheet, and FIGS. 9A, 9B, and 9C are process views for explaining the method of manufacturing the moisture absorbent sheet. FIGS. 10A, 10B, and 10C are process views for explaining a method of manufacturing the organic EL display, FIG. 11 is an explanatory view for explaining a method of manufacturing the organic EL display and FIGS. 12A and 12B are process views for explaining the method of manufacturing the organic EL display.

An organic EL display 1, as shown in FIG. 1, is provided with a transparent insulating substrate 2 such as a glass substrate, an anode layer 3, an organic EL lamination body 4 including a luminescent layer, a cathode layer 5, a seal cap 6 for storing the organic EL lamination body 4 and a like in a sealed space 1A formed with the transparent insulating substrate 2 and a moisture absorbent sheet (particle holding sheet) 7.

The anode layer 3 is formed in stripes on the transparent insulating substrate 2 and is made of transparent material such as ITO (indium tin oxide).

The organic EL lamination body 4, as shown in FIG. 1, includes a hole injection-transport layer 8, a luminescent layer 9 and an electron injection-transport layer 11 which are laminated in order.

The hole injection-transport layer 8 has functions for making injection of holes from the anode layer 3 easy, for transporting holes to the luminescent layer 9 stably and for blocking electrons coming from the side of the electron injection-transport layer 11 and is made of TPD: N,N'-diphenyl-N,N'-di(3-methylphenyl)-1,1'-biphenyl-4,4'-diamine or alike.

The luminescent layer 9 has functions of generating excitons by recombining the holes injected from the anode layer 3 with the electrons injected from the cathode layer 5 and of emitting a light in transition process, and is made up of such as $Alq_3$: tris (8-hydroxyquinolinol) Aluminum or a like.

The electron injection-transport layer 11 has functions of making injection of electrons from the cathode layer 5 easy, for transporting electrons to the luminescent layer 9 stably and for blocking holes coming from the side of the hole injection-transport layer 8 is made up of such as 3-(4-biphenylyl)-4-phenyl-5-(4-t-butylphenyl)-1,2,4-triazole or a like.

The cathode layer 5 is formed in stripes so as to be orthogonal to the anode layer 3 and is made of metal having a low work function such as aluminum.

Areas between the anode layer 3 and the cathode layer 5 which are orthogonal to each other in the organic EL lamination body 4 are used as organic EL pixels (not shown) to be luminescent display units, and the organic EL pixels are arranged in a matrix.

The seal cap 6, as shown in FIG. 1, is formed in a box-shaped cap having a predetermined depth (such as approximately 0.4 mm) of metal material such as stainless steel, glass or a like and is put on the transparent insulating substrate 2 to cover the anode layer 3, the organic EL lamination body 4, and the cathode layer 5 via a seal resin 12 of an ultraviolet-curable type.

The moisture absorbent sheet 7 is fixed to an opposed surface 6a opposite to the cathode layer 5 in the seal cap 6. The moisture absorbent sheet 7, as shown in FIG. 2, FIG. 3A and FIG. 3B, has a structure in which a particle-like moisture absorbent 13 is held by a space 15H of a sheet-type support 15 by being embedded in the space 15H and in which a gas permeable sheet 17 is fixed to the sheet-type support 15 at a side opposite to the organic EL lamination body 4 via an adhesive layer 16. The sheet-type support 15 is fixed to the opposed surface 6a of the seal cap 6 via adhesive layer 18 while holding the moisture absorbent 13.

The sheet-type support 15, as shown in FIG. 2, FIG. 3A and FIG. 3B, is a plain woven fabric in which a warp 15a and a weft 15b made of fluorine polymeric material such as PCTFE (polychlorotrifluoroethylene) or PTFE (polytetrafluoroethylene) are woven together and which has a thickness of approximately 20 μm or a like.

In this embodiment, the warp 15a and the weft 15b, each of which having a gauge of approximately 10 μm or less, are used. Also, the space 15H has a vertical dimension of approximately 10 μm along the warp 15a and a horizontal dimension of approximately 10 μm along the weft 15b.

The moisture absorbent 13 is made of particle calcium oxide (CaO) or a like having particle sizes of 2 μm to 20 μm (a mean particle size is 10 μm) as an example. When the calcium oxide absorbs moisture ($H_2O$) in the sealed space 1A, the calcium oxide reacts with the moisture to generate calcium hydroxide ($Ca(OH)_2$) and dehumidification is carried out. With this arrangement, deterioration caused by the moisture in the organic EL lamination body 4 and a like is prevented.

Particles do not pass through the gas permeable sheet 17, while water molecules (vapor) pass easily through the gas permeable sheet 17. The gas permeable sheet 17 is electrically-insulative and covers the sheet-type support 15 to prevent the moisture absorbent 13 from dropping. Air including the moisture passes through the gas permeable sheet 17.

The moisture absorbent sheet 7 according to this embodiment is made by a moisture absorbent filling apparatus 21 for filling the sheet-type support 15 with the moisture absorbent 13. The moisture absorbent filling apparatus 21 will now be explained.

The moisture absorbent filling apparatus 21, as shown in FIG. 4 and FIG. 5, is provided with an outer cylindrical portion (as a rotation body and as a support fitting member) 23 and an inner cylindrical portion (as a rotation body) 24 fixed to a same shaft 22 as a rotation axis, an electric motor 25 for rotating the shaft 22 and a lid portion 26. Only tops of the outer cylindrical portion 23 and the inner cylindrical portion 24 are opened. The inner cylindrical portion 24 is stored in the outer cylindrical portion 23. When operating by using the electric motor 25, the opened tops of the outer cylindrical portion 23 and the inner cylindrical portion 24 are covered by the lid portion 26.

As shown FIG. 4 to FIG. 6, an approximately U-shaped sheet fitting portion 27 is fixed to an inner wall face 23a of the outer cylindrical portion 23 to form grooves 27m for accepting three peripheral portions of the sheet-type support 15 with the inner wall face 23a except the top portion, because the sheet-type support 15 is inserted from the top.

The sheet fitting portion 27 includes a mounted portion 27a for mounting the sheet-type support 15 and side control portions 27b, 27b for preventing displacement of the sheet-type support 15 in a rotation direction of the outer cylindrical portion 23.

The moisture absorbent 13 is stored in the inner cylindrical portion 24. A plurality of apertures 28a through which the moisture absorbent 13 can pass are made in a band to form a moisture absorbent effluence portion 28. A length "a" of the moisture absorbent effluence portion 28 along a vertical direction is approximately equal to a length of the sheet-type support 15 so as to prevent unnecessary moisture absorbent 13 from effusing to portions to which no sheet-type support 15 is fixed.

Next, a method of manufacturing the moisture absorbent sheet 7 will be explained.

First, the sheet-type support 15 is prepared and, as shown in FIG. 7 and FIG. 8, is fixed to the sheet fitting portion 27 of the moisture absorbent filling apparatus 21. Then, the moisture absorbent 13 is put into the inner cylindrical portion 24. During this time, the moisture absorbent 13 is put into the inner cylindrical portion 24 until an upper position of a height corresponding to an amount to be held by the sheet-type support 15. With this arrangement, the moisture absorbent 13 is collided with the sheet-type support 15 evenly.

Then, the electric motor 25 is started in order to rotate the outer cylindrical portion 23 and the inner cylindrical portion 24 at a predetermined rotation speed. The rotation speed set to, for example, several thousand (rpm).

With these processes, the sheet-type support 15 is pressed and fixed to the inner wall face 23a of the outer cylindrical portion 23 by a centrifugal force. Also, the moisture absorbent 13 is effused by the centrifugal force, collides with the sheet-type support 15 and is embedded in the space 15H (refer to FIG. 2). After the electric motor 25 is operated for a predetermined time, a predetermined amount of the moisture absorbent 13 is embedded and filled in the sheet-type support 15.

In this way, as shown in FIG. 9A, the sheet-type support 15 in which the moisture absorbent 13 is held by the space 15H is obtained and, as shown in FIG. 9B, the adhesive layers 16, 18 are formed on both sides of the sheet-type support 15. Then, as shown in FIG. 9C, the gas permeable sheet 17 is fixed to the sheet-type support 15 via the adhesive layer 16 and a removable protecting sheet 19 is fixed to the sheet-type support 15 via the adhesive layer 18. With this operation, the moisture absorbent sheet 7 can be obtained.

Next, explanations will be given of a method of manufacturing the organic EL display 1 using the moisture absorbent sheet 7 for heremetical sealing.

As shown in FIG. 10A, by a sputtering technique, ITO film is formed on the transparent insulating substrate 2 such as a glass substrate which is thoroughly washed, and then is patterned by a photography technique to make the anode layer 3 in stripes.

Then, as shown in FIG. 10B, on the transparent insulating substrate 2 on which the anode layer 3 is formed, N,N'- diphenyl-N,N'-di(3-methylphenyl)-1,1'-biphenyl-4,4'-diamine or a like is deposited in a predetermined pattern by a vacuum evaporation technique using a shadow mask to form the hole injection-transport layer 8.

Then, by using the vacuum evaporation technique similarly to the hole injection-transport layer 8, tris (8-hydroxyquinolinol) Aluminum is deposited to form the luminescent layer 9. On the luminescent layer 9, 3-(4-biphenylyl)-4-phenyl-5-(4-t-butylphenyl)-1,2,4-triazole is deposited to form the electron injection-transport layer 11.

With these processes, the organic EL lamination body 4 in which the hole injection-transport layer 8, the luminescent layer 9 and electron injection-transport layer 11 are laminated in order is obtained.

Then, as shown in FIG. 10C, aluminum or like is deposited in a predetermined pattern by the vacuum evaporation technique using a shadow mask to form the cathode layer 5 in stripes perpendicular to the anode layer 3 as shown in FIG. 11.

Next, as shown in FIG. 12A, the protecting sheet 19 has been removed from the moisture absorbent sheet 7, and the adhesive layer 18 has come in contact with the opposed face 6a in the seal cap 6 and the moisture absorbent sheet 7 is overlaid on the opposed face 6a.

Seal resin 12 of an ultraviolet-curable type is applied to a lower end face of a side wall of the seal cap 106 in which the moisture absorbent sheet 7 is overlaid on the opposed face 6a.

Then, as shown in FIG. 12B, under an inert gas atmosphere such as nitrogen gas or argon gas, the seal cap 6 is put on the transparent insulating substrate 2 and a side wall end face 6b of the seal cap 6 is joined to the transparent insulating substrate 2 via the uncured seal resin 12.

Then, ultraviolet rays UV are irradiated from the side of the transparent insulating substrate 2 so as to cure the seal resin 12. Therefore, the anode layer 3, the organic EL lamination body 4, and the cathode layer 5 are sealed by the seal cap 6 while being filled with nitrogen gas or argon gas. With these processes, the organic EL display 1 is completed.

As described above, according to this embodiment, the moisture absorbent 13 is held by the sheet-type support 15 using the centrifugal force. In this process, by adjusting the rotation speed of the electric motor 25, the effluence time of the moisture absorbent 13 and a like, it is possible to fill the sheet-type support 15 with a desired amount of the moisture absorbent 13 certainly and accurately. Also, by the centrifugal force, it is possible to manufacture the moisture absorbent sheet 7 speedily.

Further, when the organic EL display 1 is manufactured, the moisture absorbent sheet is put into the seal cap 6 together with the organic EL lamination body, and therefore, it is possible to enclose a predetermined amount of the moisture absorbent 13 certainly and accurately.

Furthermore, since the moisture absorbent 13 is held by the sheet-type support 15, in comparison with the conventional technique in which the concave portion of the seal cap is filled with the moisture absorbent, it is possible to use the moisture absorbent effectively using a same amount of moisture absorbent. Therefore, good absorbency can be kept.

For example, in the above-mentioned conventional technique, the moisture absorbent is put into the concave portion formed in a limited area of the seal cap, and all of the moisture absorbent can not be used effectively. On the contrary, since the moisture absorbent 13 is distributed and put into an area corresponding to a sectional area of the seal cap 6, it is possible to use the moisture absorbent 13 effectively.

Therefore, it is possible to carry out a long lifetime of the organic EL display 1.

In other words, as a result of an experiment by the inventor, when no moisture absorbent was put, a lifetime to no luminescence under room temperature was approximately two months. When the moisture absorbent was put into the concave portion of the seal cap in the conventional technique, the lifetime under a same condition was approximately 30,000 hours. Also, the moisture absorbent sheet holding the same amount of the moisture absorbent as in the conventional technique was able to achieve approximately 55,000 hours. In addition, the measured results of the lifetimes were obtained under a condition in that the moisture absorbent of approximately 30 mg was put into the cap of which a sectional area was approximately 50 mm×45 mm.

As described above, according to this embodiment, it was understood that the lifetime was able to be extended to approximately 40 times or more in comparison with a case in that no moisture absorbent was put, and to approximately twice in comparison with the conventional technique in that the moisture absorbent was stored in the concave portion of the seal cap.

Also, it is possible to enclose the moisture absorbent 13 easily and speedily without troubles. It is possible to reduce a number of steps required to manufacture the organic EL display 1.

Also, the moisture absorbent sheet is used when the organic EL display 1 is manufactured, and therefore it is unnecessary to pay attention to dealing with the moisture absorbent; for example, there is no case in that the moisture absorbent 13 is dropped wastefully.

Further, since it is unnecessary to form the concave for storing the moisture absorbent 13 in the seal cap 6, the thickness of the seal cap 6 can be made thin, and therefore, the organic EL display can be made thin and small as a whole.

Furthermore, since a shape of the seal cap 6 is simple, the seal cap 6 can be made easily by press molding or a like.

SECOND EMBODIMENT

FIGS. 13A to 13D are process views for explaining a method of the moisture absorbent sheet 13 according to a second embodiment of the present invention.

As a main difference between the first embodiment and the second embodiment, instead of a method for embedding a moisture absorbent 13 into a sheet-type support 15 using a centrifugal force when the moisture absorbent sheet 7 is manufactured, the moisture absorbent 13 is scattered and is pressed by rollers so as to be put into the sheet-type support 15.

Figure 13A:
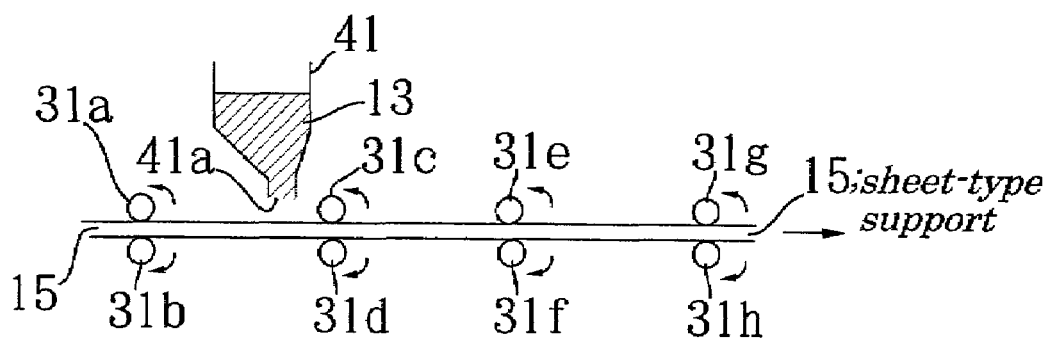
FIGS. 13A, 13B, 13C and 13D are process views for explaining a method of manufacturing a moisture absorbent sheet according to a second embodiment of the present invention.

First, as shown in FIG. 13A, the sheet-type support 15 is set forward by a pair of rollers, a roller 31a and a roller 31b, for rotating while respectively pressing an upper face and an lower face of the sheet-type support 15.

At a predetermined position, a hopper 41 is positioned for supplying the moisture absorbent 13. As shown in FIG. 13A, the moisture absorbent 13 is scattered onto the sheet-type support 15 from an exhaust port 41a. A width of the exhaust port 41a in a perpendicular direction to a carrying direction of the sheet-type support 15 is approximately equal to a width of the sheet-type support 15, and therefore, the moisture absorbent 13 is scattered evenly.

Then, as shown in FIG. 13A, the moisture absorbent 13 is pressed by pairs of rollers 31c and 31d, rollers 31e and 31f and rollers 31g and 31h together with the sheet-type support 15, and therefore, the moisture absorbent 13 is embedded into the sheet-type support 15.

Figure 13B:
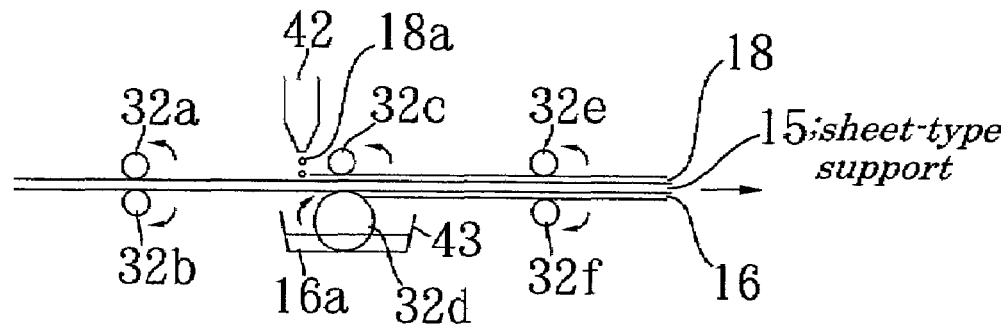

As shown in FIG. 13B, the sheet-type support 15 is carried to a position of a feeder 42 for supplying adhesive 18a used to form an adhesive layer 18 and of a container 43 for applying 16a used to form an adhesive layer 16 by a roller 32a and a roller 32b.

At this position, the adhesive 18a is dropped on the upper face of the sheet-type support 15 and then is applied by a roller 32c evenly to form the adhesive layer 18 and the adhesive is applied on the lower face of the sheet-type support 15 by a roller 32d to form the adhesive layer 16. Then, the sheet-type support 15 is carried ahead for a next step by a roller 32e and a roller 32f.

Figure 13C:
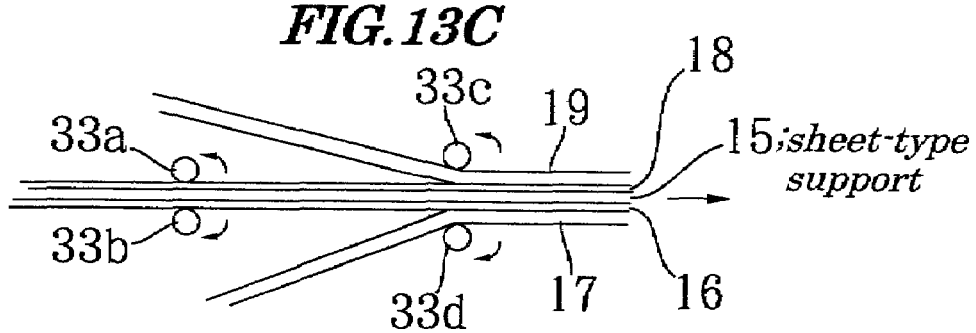

As shown in FIG. 13C, the sheet-type support 15 is carried to a position for laminating the gas permeable sheet 17 and the protecting sheet 19 by a roller 33a and a roller 33b. The gas permeable sheet 17 and the protecting sheet 19 are pressed to the sheet-type support 15 by a roller 33c and a roller 33d.

Figure 13D:
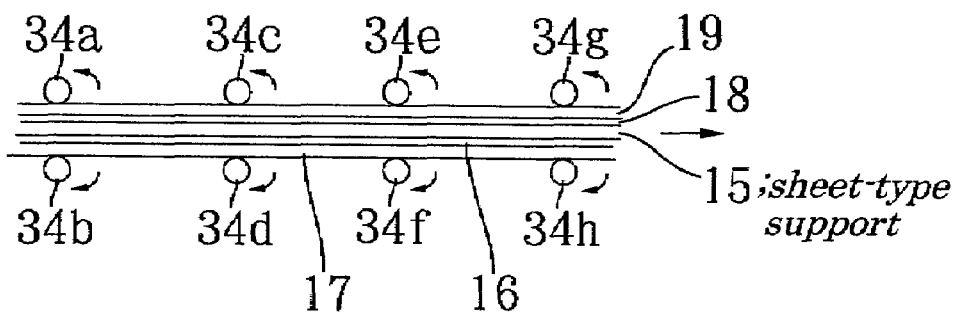
Figure 14:
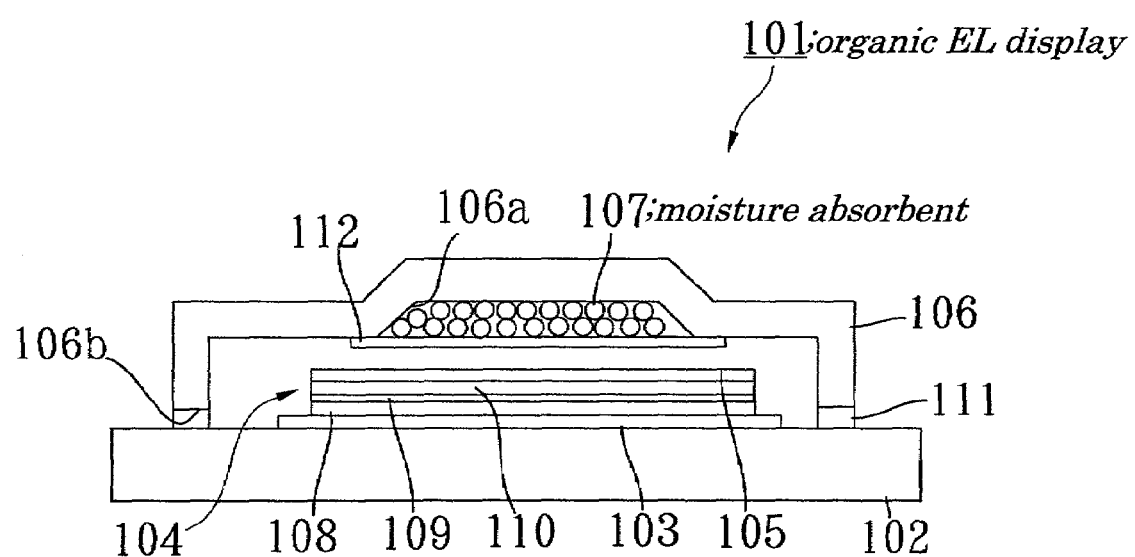
FIG. 14 is an explanatory view for explaining a conventional technique of manufacture of a conventional organic EL display.
Figure 15A:
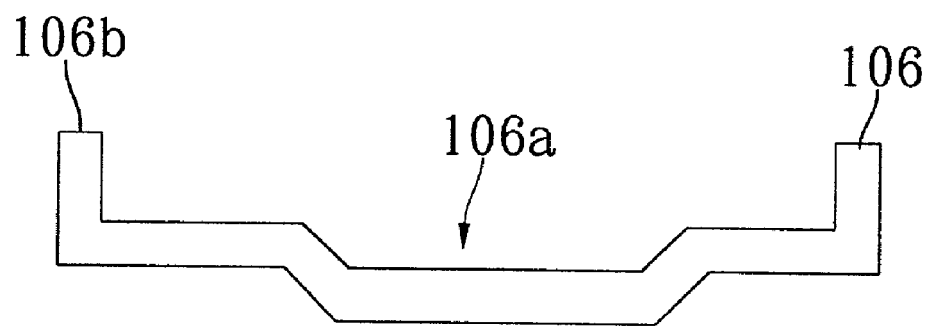
FIGS. 15A, 15B, and 15C are explanatory views for explaining the conventional technique of manufacture of the conventional organic EL display.
Figure 15B:
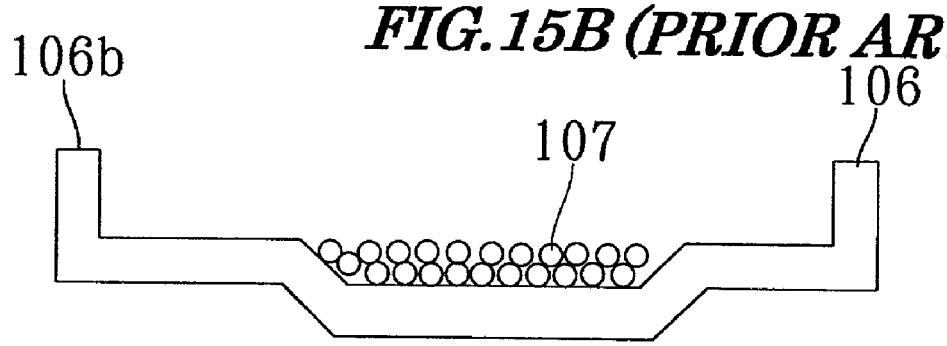
Figure 15C:
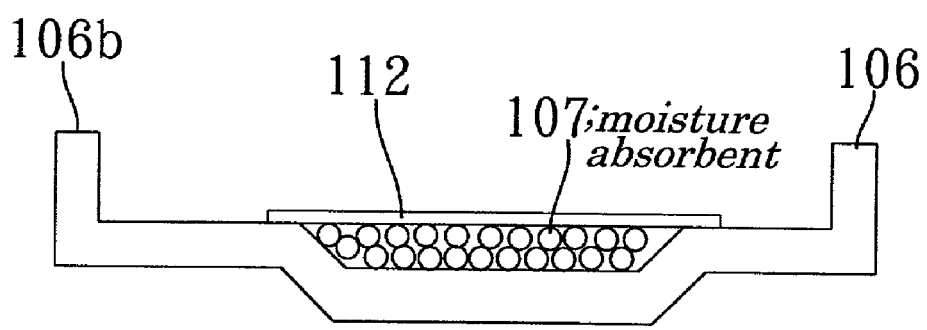

Then, after a drying step or a like, as shown in FIG. 13D, the gas permeable sheet 17 and the protecting sheet 19 are respectively laminated via the adhesive layer 16 and the adhesive layer 18. Thereafter, the moisture absorbent sheet 7 is completed after a cut step of cutting the sheet-type support 15 at a predetermined size.

As described above, according to this embodiment, by adjusting a supply amount of the moisture absorbent 13, a carrying speed of the sheet-type support 15 and a like, it is possible to fill a desired amount of moisture absorbent 13 into the sheet-type support 15 certainly and accurately.

It is thus apparent that the present invention is not limited to the above embodiments but may be changed and modified without departing from the scope and spirit of the invention.

For example, in the above-mentioned embodiments, a plain woven fabric is used as the sheet-type support 15, however, the present invention is not limited to the plain woven fabric and a twill woven fabric and a SHUSHI woven fabric having lots of spaces may be used. Also, the present invention is not limited to woven fabrics; and a nonwoven fabric having lots of spaces may be used. Further, a porous foam body such as a polyurethane foam body may be used as the sheet-type support 15.

In this way, if only the sheet-type support 15 has lots of spaces, by embedding the moisture absorbent in the spaces, it is possible to obtain a moisture absorbent sheet. Then, by using the moisture absorbent sheet when an organic EL display is manufactured, it is possible to enclose the moisture absorbent easily, simply, and speedily without problems.

Also, the space 15H is not always necessary to penetrate through the sheet-type support 15 and may be opened at a side opposite to the organic EL lamination body 4.

Also, the thickness of the sheet-type support 15 is not always necessary to be approximately 20 μm and may be 100 μm. A plurality of the sheet-type supports 15 may be wrapped over and the sheet-type support 15 may be folded.

Also, the shape of the sheet-type support 15 may be rectangular, circular, or irregular. It is possible to cut the sheet-type support 15 into a suitable size and a suitable shape in accordance with a fitting position state of the moisture absorbent sheet. It is also possible to wrap over the moisture absorbent sheet if necessary and to change the shape of the moisture absorbent sheet freely. A plurality of moisture absorbent sheets may be used.

Further as thread textile materials, the present invention is not limited to fluorine polymeric materials, and PET (Poly-Ethylene Tetraphthalate) or a like may be used.

Also, textile made of water-absorbing polymeric materials or hollow fibrous textiles which are previously dried sufficiently may be used. With these textiles, it is possible to increase an absorbable moisture amount.

Also, the moisture absorbent is not limited to calcium oxide; barium oxide (BaO), magnesium oxide (MgO), aluminum oxide ($Al_2O_3$), phosphorus oxide (such as diphosphorus pentoxide ($P_2O_5$), or a like may be used. Absorbing the moisture, these oxides react with the moisture and chemical changes occur as well as calcium oxide. Therefore, there is no case in that the moisture effuses even though heated.

Further, zeolite, silica gel, activated carbon or a like which absorbs moisture physically may be used as the moisture absorbent. Also, a deliquescent substance such as calcium chloride ($CaCl_2$) and magnesium chloride ($MgCl_2$) may be used as the moisture absorbent. In this case, the deliquescent substance is made into an aqueous solution, the sheet-type support is soaked in the aqueous solution or the aqueous solution is sprayed onto the sheet-type support, and then the sheet-type support is heated and dried to manufacture the moisture absorbent sheet. It is also possible to mix moisture absorbent for absorbing moisture physically and moisture absorbent for absorbing moisture chemically.

The seal cap 6 is not limited to metal material such as stainless steel; and transparent glass or a like may be formed into a cap.

The anode layer is not limited to ITO; and tin oxide ($SnO_2$) or a like may be used if only transparent.

In the organic EL lamination body, the hole injection-transport layer is not limited to N,N'-diphenyl-N,N'-di (3-methylphenyl)-1,1'-biphenyl-4,4'-diamine; a hydrazone derivative, a carbazole derivative, a triazole derivative, or a like may be used. The luminescent layer 9 is not limited to tris (8-hydroxyquinolinol) aluminum; and a phenylanthracene derivative, a tetraallylethene derivative, or a like may be used. The electron injection-transport layer 11 is not limited to 3-(4-biphenylyl)-4-phenyl-5-(4-t-butylphenyl)-1, 2,4-triazole; and a pyridine derivative, a diphenylquinone derivative, or a like may be used.

The hole injection-transport layer may divided into two layers including a hole injection layer and a hole transport layer and the two layers may be laminated. In this case, a compound used in the hole injection layer has low potential. Similarly, the electron injection-transport layer may be divided into two layers including an electron injection layer and an electron transport layer and the two layers may be laminated.

A function of a luminescent layer may be added to the hole injection-transport layer. Also, the organic EL lamination body may include a hole transport layer and a luminescent layer and may include only a luminescent layer.

The cathode layer is not limited to aluminum; and magnesium, aluminum-lithium alloy, or a like may be used.

In the first embodiment, in a moisture absorbent filling apparatus 21, an inner cylindrical portion 24, and an outer cylindrical portion 23 are rotated at the same time, however, the inner cylindrical portion 24 and the outer cylindrical portion 23 may be rotated at respective rotation speeds or only the inner cylindrical portion 24 may be rotated. With this arrangement, it is also possible to insert the moisture absorbent into the sheet-type support.

In this case, the inner cylindrical portion 24 and the outer cylindrical portion 23 may be rotated reversely. With this arrangement, since it is possible to embed the moisture absorbent into the sheet-type support with a more impact force of collision, large amounts of the moisture absorbent can be held by the sheet-type support.

In the second embodiment, the case in that the moisture absorbent is pressed into the sheet-type support by the pairs of rollers is described. Also, after scattering the moisture absorbent over the sheet-type support evenly, the moisture absorbent may be pressed into the sheet-type support by using a press tool having a press surface which is a plain surface to press the press surface to the tool sheet-type support.

Also, the moisture absorbent may be embedded into spaces of the sheet-type support by supplying the moisture absorbent from one side of the sheet-type support, by keeping a pressure at the other side of the sheet-type under a pressure at the one side (such as atmospheric pressure) and by inhaling the moisture absorbent via the gas permeable sheet.

Also, the moisture absorbent sheet 7 may be provided with the gas permeable sheet 17 and the adhesive layer 18 if necessary, and the gas permeable sheet 17 and the adhesive layer 18 may be omitted.

Also, in the embodiment, descriptions are given of the case in that the adhesive layer 18 is previously provided at a side of the moisture absorbent sheet 7 and the moisture absorbent sheet 7 is fixed to the seal cap 6, however, the adhesive layer 18 may be previously provided at the opposed face 6a of the seal cap 6 and the moisture absorbent sheet 7 may be fixed to the seal cap 6. With this arrangement, the protecting sheet 19 can be omitted.

Also, the moisture absorbent sheet 7 may be fixed to a side wall surface in addition to the opposed face 6a in the seal cap 6. Further, the moisture absorbent sheet 7 may be fixed to only the side wall surface.

In the embodiments, descriptions are given of the case in that the moisture absorbent sheet 7 is applied to the organic EL display, however, the moisture absorbent sheet 7 may be applied to an inorganic EL, a solar battery module, and a like and is not limited to the organic EL display.

Furthermore, particles held by the particle holding sheet of the present invention are not limited to the moisture absorbent and may be particles such as magnetic powder, catalyst, and oxygen moisture absorbent.

By using the particle holding sheet for holding particles, it is also possible to solve difficulty when dealing with particles and it is possible to embed particles into a needed position easily and speedily without problems.

What is claimed is:

1. A particle holding sheet for holding a plurality of particles in such a manner that said plurality of particles is held by a support of a sheet-type,
    wherein said support has a plurality of spaces connecting to an outside at least at a face of said support, at least a part of said particles is held in one of said spaces and said particles are made up of moisture absorbent, and
    wherein a gas permeable sheet for allowing air to pass and for not allowing said particles to pass is fixed to a face of said support and an adhesive layer is arranged on another face of said support.

2. The particle holding sheet according to claim 1, wherein said support is made of woven fabric or unwoven fabric.

3. The particle holding sheet according to claim 1, wherein said support is made of foam materials.

4. The particle holding sheet according to claim 1, wherein said support is made of water-absorbing polymeric materials.

5. The particle holding sheet according to claim 1, wherein said moisture absorbent absorbs moisture physically and/or chemically.

6. The particle holding sheet according to claim 5, wherein said moisture absorbent is at least one absorbent selected from the group consisting of calcium oxide, barium oxide, magnesium oxide, aluminum oxide, and phosphorus oxide.

7. The particle holding sheet according to claim 5, wherein said moisture absorbent is at least one absorbent selected from the group consisting of zeolite, silica gel, and activated carbon.

8. An organic EL display is provided with a particle holding sheet for holding a plurality of particles in such a manner that said plurality of particles is held by a support of a sheet-type,
    wherein said support has a plurality of spaces connecting to an outside at least at a face of said support and at least a part of said particles is held in one of said spaces, wherein said particles are made up of moisture absorbent, and
    wherein a gas permeable sheet for allowing air to pass and for not allowing said particles to pass is fixed to a face of said support and an adhesive layer is arranged on another face of said support.

9. The particle holding sheet according to claim 1, wherein said support is made of woven fabric selected from a plain woven fabric, a twill woven fabric and a satin woven fabric.

10. The particle holding sheet according to claim 1, where said support is made of fluorine polymeric materials on polyethylene terephthalate.

11. An organic EL display device comprising:
    a substrate;
    a lower electrode;
    at least one organic layer formed on the lower electrode;
    an upper electrode formed on the organic layer;
    a seal substrate; and
    a moisture absorbing sheet formed between the upper electrode and the seal substrate, wherein the moisture absorbing sheet has a support of a sheet-type holding a plurality of moisture absorbing particles.

12. The organic EL display device of claim 11, wherein the moisture absorbing sheet is formed on the seal substrate.

13. The organic EL display device of claim 11, wherein a space is between the moisture absorbing sheet and the upper electrode.

14. The organic EL display device of claim 13, wherein at least one of the plurality of moisture absorbing particles is fased to the space.

* * * * *